United States Patent
Bahramian

(10) Patent No.: US 8,350,296 B2
(45) Date of Patent: Jan. 8, 2013

(54) ENHANCEMENT MODE III-NITRIDE DEVICE WITH FLOATING GATE AND PROCESS FOR ITS MANUFACTURE

(75) Inventor: Hamid Tony Bahramian, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 579 days.

(21) Appl. No.: 12/195,801

(22) Filed: Aug. 21, 2008

(65) Prior Publication Data

US 2010/0044751 A1  Feb. 25, 2010

(51) Int. Cl.
*H01L 29/66* (2006.01)

(52) U.S. Cl. ............... 257/194; 257/195; 257/E29.246; 257/E29.247; 257/E29.248; 257/E29.252; 257/E21.407

(58) Field of Classification Search .............. 257/194, 257/195, E29.246, E29.247, E29.248, E29.252, 257/E21.407
See application file for complete search history.

(56) References Cited

U.S. PATENT DOCUMENTS 6,191,444 B1 * 2/2001 Clampitt et al. ............... 257/315
2007/0187718 A1 * 8/2007 Suzuki et al. .................. 257/194

* cited by examiner

*Primary Examiner* — Bradley K Smith
*Assistant Examiner* — Amar Movva
(74) *Attorney, Agent, or Firm* — Farjami & Farjami LLP

(57) ABSTRACT

An enhancement mode III-Nitride device has a floating gate spaced from a drain electrode which is programmed by charges injected into the floating gate to form a permanent depletion region which interrupts the 2-DEG layer beneath the floating gate. A conventional gate is formed atop the floating gate and is insulated therefrom by a further dielectric layer. The device is a normally off E mode device and is turned on by applying a positive voltage to the floating gate to modify the depletion layer and reinstate the 2-DEG layer. The device is formed by conventional semiconductor fabrication techniques.

11 Claims, 2 Drawing Sheets

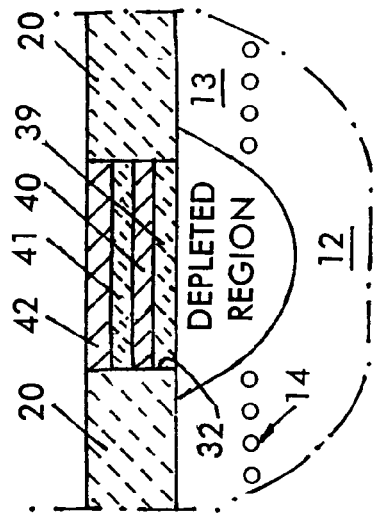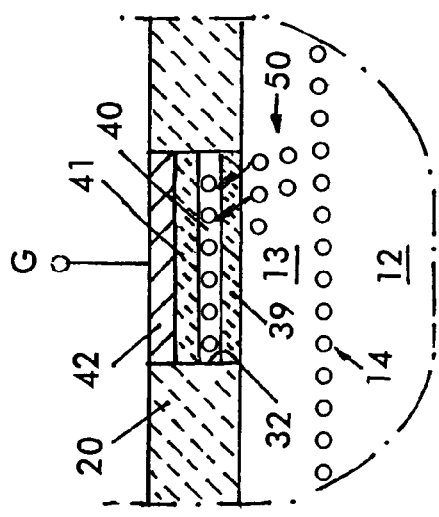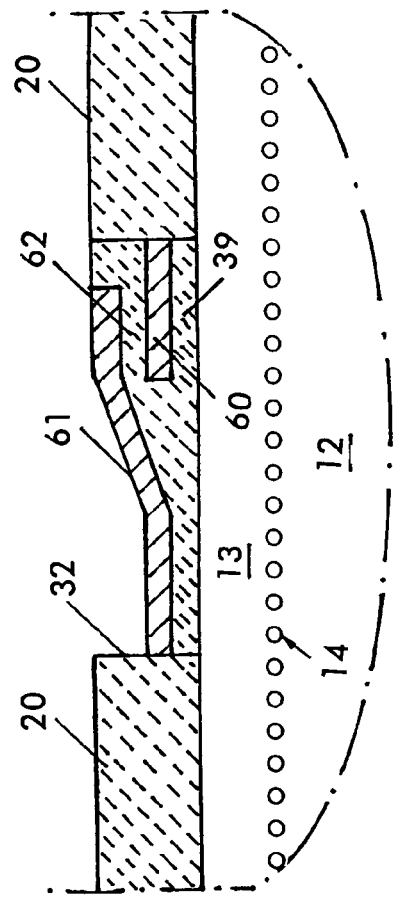

ENHANCEMENT MODE III-NITRIDE DEVICE WITH FLOATING GATE AND PROCESS FOR ITS MANUFACTURE

FIELD OF THE INVENTION

This invention relates to III-Nitride semiconductor devices and more specifically relates to an enhancement mode III-Nitride device and a process for its manufacture.

BACKGROUND OF THE INVENTION

III-Nitride semiconductor devices are well known. In such devices, a 2-DEG conductive layer is formed at the boundary surface between two layers, for example, a bottom GaN layer and a top AlGaN layer. Spaced source and drain electrodes are connected to the AlGaN layer. A gate electrode, which may be an insulated gate or Schottky gate is disposed between the source and drain electrodes. When a gate potential is applied to the gate, the 2-DEG layer under the gate is interrupted. Thus, the device is normally conductive and "on" (in the absence of a gate signal) and is turned "off" in response to the gate signal. The device is therefore a normally on switch and is a depletion mode (D-mode) device.

In many applications it is desirable to have a normally off switch device which is turned on in response to a gate signal (an enhancement mode or E-mode device). The use for a depletion mode device is such applications complicates the drive circuitry and adds cost when it is desired to otherwise employ the desired characteristics of the III-Nitride device.

Structures are known to make a III-Nitride device operate as an enhancement mode device. These arrangements, however, require complicated processing steps and circuitry. It would be very desirable to form an enhancement mode III-Nitride device which employ standard processing technology.

SUMMARY OF THE INVENTION

A III-Nitride MISHFET device is proposed, with an extra and floating gate. The floating gate can be easily fabricated using standard process technology. The purpose of the floating gate is to hold or store charge, which adjust the threshold voltage of the device. By applying a high programming voltage to the drain, a high electric field region is created close to the edge of the gate. This electric field imparts a high enough energy to electrons to cause them to jump the barrier at the AlGaN-Dielectric interface. These electrons then accumulate in the floating gate. The presence of these negatively charged electrons creates a depletion region below the gate region of the device, thus cutting off the 2-DEG area under the gate. Therefore, the device is no longer a D-mode device, and, rather, it is a normally off E-mode device. For normal operation of the programmed device, a positive voltage is applied to the gate, which then attracts the electrons back to the 2-DEG layer to turn-on the device.

The dielectric thickness under the floating gate, and gate to drain distance or spacing are designed such that a high voltage (relative to normal operating drain voltage) will program the device one-time. For example, a programming voltage of 50V is used if the device normal operating voltage on the gate is 5V and 20V on the drain. In this situation, the charges in the floating gate remain and do not discharge.

Other floating gate geometries can be used, in order to optimize the programming voltage, reduce the device area and increase reliability.

BRIEF DESCRIPTION OF THE DRAWINGS

FIG. 2 shows the gate portion of the device of FIG. 1 and schematically shows the accumulation of electrons in the floating gate during a programming step.

FIG. 3 shows the gate portion of the device of FIG. 2 and the formation of a depletion region beneath the floating gate to cut off the 2-DEG layer under the gate to convert the device to an E-mode device.

FIG. 4 shows a second embodiment of the gate portion of the device of FIG. 1 with a modified gate structure.

DETAILED DESCRIPTION OF THE PREFERRED EMBODIMENTS

Figure 1:
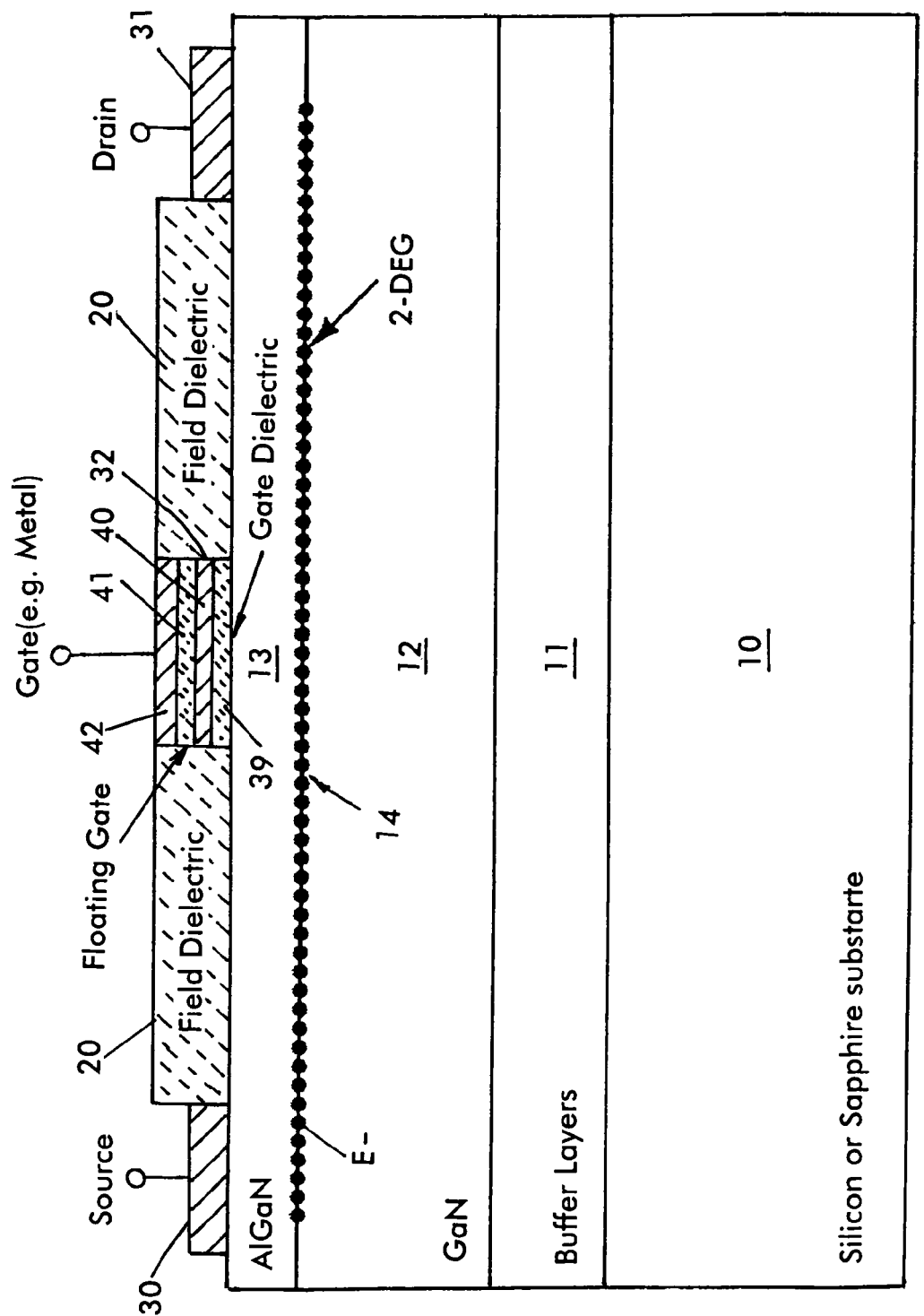
FIG. 1 is a cross-section of a III-Nitride die constructed in accordance with a first embodiment of the invention.

Referring first to FIG. 1, there is shown a cross-sectional view of a III-Nitride device having a floating gate, in accordance with the invention. It will be understood by those skilled in the art that the device shown may be made in wafer form in which a large number of such devices are simultaneously processed and singulated from the wafer after fabrication; and that the dimensions of the device are greatly exaggerated, for clarity.

The device of FIG. 1 is fabricated on a substrate 10 which may be silicon or sapphire or the like. Conventional buffer layers 11 are deposited atop substrate 10.

A GaN layer 12 is then conventionally deposited atop buffer layers 11 and an AlGaN layer 13 is conventionally deposited atop GaN layer.

A conductive 2-DEG layer 14 schematically represented as electrons is conventionally formed at the interface between layers 12 and 13.

The top surface of AlGaN layer 13 then receives a suitable dielectric layer 20 which can, for example, be $SiO_2$. The layer 20 may be photolithographically processed to open windows to receive conductive source and drain contacts 30 and 31 respectively and a window 32 in which the gate structure can be formed.

In accordance with the invention, a conductive floating gate 40, which may be a metal or a conductive polysilicon, is deposited atop gate dielectric 39 at a lateral position between the source 30 and drain 31, using conventional photolithographic processing.

A further gate dielectric 41 is deposited atop floating gate 40 and a conductive control gate 42, which can be a suitable conductor such as a metal, is deposited atop dielectric layer 41. Both dielectric layer 41 and control gate 42 are again formed, using conventional photolithographic processes.

As stated previously, the 2-DEG layer is normally conductive so that the circuit between source and drain electrodes 30 and 31 is normally conductive on that the device is a normally on D-mode device. In accordance with the invention, however, the floating gate 40 will hold or store charge to adjust the threshold voltage of the device.

Thus, as shown in FIG. 2, by applying a high voltage (compared to normal device operating drain voltage) to the drain, a high electric field is applied to the right hand edge of floating gate 40. This electric field imports a high energy to electrons 50 which can then jump the barrier at the interface between AlGaN layer 13 and dielectric layer 39 under floating gate 40.

These electrons then accumulate in the floating gate 40. The presence of these negatively charged electrons 50 creates a depletion region 51 (FIG. 3) below gate 40, thus cutting off the 2-DEG layer under the gate.

The device of FIG. 3 is, therefore, no longer a D-mode device but, rather, becomes a normally off E-mode device. For normal operation of the device of FIG. 3, a positive voltage relative to drain 31 is applied to gate 41, which then attracts electrons 50 back to the 2-DEG layer 14 to turn on the device between the source and drain electrodes 30 and 31 respectively.

The dielectric 39 thickness under the gate 40 and the spacing between the facing edges of gate 40 and drain 31 are selected such that a high voltage, for example 50 volts, on drain 31 will "program" the device one time, when the normal operating voltage on the gate 42 is 5 volts and on the drain is 20 volts. In this manner, the charges remain in the floating gate and do not permanently discharge.

In the device of FIGS. 1 to 3, the dielectric 39 is $SiO_2$ of thickness from 30 Å to 110 Å and preferably 90 Å. Other dielectrics such as hafnium aluminum oxide can be used. Gate 40 may have a width of 0.2 µm to 0.4 µm and may be a strip extending parallel to source strip 30 and drain strip 31. The spacing between the facing edges of gate 40 and drain 31 may be in the range of 1.0 µm to 1.5 µm and is preferably 1.0 µm. The programming voltage on drain 31 to initially charge floating gate 40 is from 40 volts to 70 volts and is preferably 50 volts for a normal operating drain voltage of 20 volts.

The thickness of AlGaN layer may range from 150 Å to 250 Å and is preferably 200 Å.

Other floating gate geometries can be used than that shown in FIGS. 1 to 3. Thus, in FIG. 4, the floating gate 60 may be formed under a portion of control gate 61 which extends over dielectric 62 and contacts the surface of dielectric 20. The floating gate geometry selected should optimize the programming, reduce area and increase reliability.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. An enhancement mode III-Nitride device comprising first and second adjacent and diverse III-Nitride layers defining a 2-DEG normally conductive layer at their interface;
   spaced source and drain electrodes connected to a top surface of said first III-Nitride layer;
   a field dielectric layer disposed between said source and drain electrodes; and
   a floating gate structure supported on said top surface of said first III-Nitride layer and disposed between said source and drain electrodes in a window formed in said field dielectric layer;
   said floating gate structure comprising a first dielectric layer fixed to said top surface of said first III-Nitride layer and a conductive floating gate disposed atop said first dielectric layer;
   a second dielectric layer disposed atop said conductive floating gate and a conductive control gate partially disposed atop said second dielectric layer such that a bottom surface of a portion of said conductive control gate is horizontally coplanar with a bottom surface of said conductive floating gate.

2. The device of claim 1, which further includes a fixed electron charge in said floating gate to produce a depletion region which interrupts said 2-DEG layer in the absence of a turn-on gate voltage on said control gate.

3. The device of claim 2, wherein the application of a control turn on voltage to said conductive control gate reduces the charge in said floating gate to restore the conduction of said 2-DEG layer under said floating gate to turn on the device.

4. The device of claim 1, wherein said first III-Nitride layer is an AlGaN layer and said second III-Nitride layer is a GaN layer.

5. The device of claim 2, wherein said first III-Nitride layer is an AlGaN layer and said second III-Nitride layer is a GaN layer.

6. The device of claim 3, wherein said first III-Nitride layer is an AlGaN layer and said second III-Nitride layer is a GaN layer.

7. A process of manufacture of an enhancement mode III-Nitride device;
   said III-Nitride device comprising first and second adjacent III-Nitride layers defining a 2-DEG normally conductive layer at their interface; and spaced source and drain electrodes connected to a top surface of said first III-Nitride layer;
   a field dielectric layer disposed between said source and drain electrodes; and
   a floating gate structure supported on said top surface of said first III-Nitride layer and disposed between said source and drain electrodes in a window formed in said field dielectric layer;
   said floating gate structure comprising a first dielectric layer fixed to said top surface of said first III-Nitride layer;
   a conductive floating gate disposed atop said first dielectric layer;
   a second dielectric layer disposed atop said conductive floating gate; and
   a conductive control gate partially disposed atop said second dielectric layer such that a bottom surface of a portion of said conductive control gate is horizontally coplanar with a bottom surface of said conductive floating gate;
   said process including the injection of an electron charge into said conductive floating gate.

8. The process of claim 7, wherein said device is turned on by applying a positive voltage to said control gate to reduce the charge in said floating gate.

9. The process of claim 7, wherein said first III-Nitride layer is AlGaN and said second III-Nitride layer is GaN.

10. The process of claim 9, wherein said first III-Nitride layer is AlGaN and said second III-Nitride layer is GaN.

11. An enhancement mode III-Nitride device having a floating gate which is permanently negatively charged to normally interrupt a 2-DEG layer beneath the floating gate, and a control gate fixed at least partially above said floating gate and insulated therefrom to reduce said charge in said floating gate in response to a control voltage applied to said control gate to enable the reestablishment of said 2-DEG layer;
   wherein a bottom surface of a portion of said control gate is horizontally coplanar with a bottom surface of said floating gate.

* * * * *